(12) United States Patent
Chen

(10) Patent No.: US 7,545,175 B2
(45) Date of Patent: Jun. 9, 2009

(54) SLEW RATE CONTROLLED DIGITAL OUTPUT BUFFER WITHOUT RESISTORS

(75) Inventor: Kuo-Ji Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 134 days.

(21) Appl. No.: 11/517,675

(22) Filed: Sep. 8, 2006

(65) Prior Publication Data

US 2008/0061831 A1 Mar. 13, 2008

(51) Int. Cl.
*H03K 19/094* (2006.01)
*H03K 19/0175* (2006.01)
*H03K 17/16* (2006.01)
*H03B 1/00* (2006.01)

(52) U.S. Cl. .............................. 326/83; 326/26; 326/95; 327/170

(58) Field of Classification Search ........................ None
See application file for complete search history.

(56) References Cited

U.S. PATENT DOCUMENTS

| 6,970,015 | B1 * | 11/2005 | Chan et al. ..................... 326/82 |
| 2003/0189446 | A1 * | 10/2003 | Yoo et al. ..................... 327/108 |
| 2007/0024328 | A1 * | 2/2007 | Shin ........................... 327/112 |

\* cited by examiner

*Primary Examiner*—Rexford Barnie
*Assistant Examiner*—Dylan White
(74) *Attorney, Agent, or Firm*—K & L Gates LLP

(57) ABSTRACT

An output buffer for an IC includes a PMOS transistor having a source coupled to an operating voltage, and an NMOS transistor serially coupled between a drain of the PMOS transistor and a complementary operating voltage. A first driver is coupled to a gate of the PMOS transistor for selectively turning on or off the same. A second driver is coupled to a gate of the NMOS transistor for selectively turning on or off the same. A decoder is coupled to the first and second drivers for controlling the first driver or the second driver to turn on the PMOS transistor or the NMOS transistor at a high rate or a low rate in response to slew rate control signals indicating a slew rate control mode or a non-slew rate control mode.

14 Claims, 5 Drawing Sheets

SLEW RATE CONTROLLED DIGITAL OUTPUT BUFFER WITHOUT RESISTORS

BACKGROUND

The present invention relates generally to integrated circuits (ICs), and more specifically to output buffers operable in a slew rate control mode or non slew rate control mode.

Digital ICs use output buffers to drive an external load. Output buffers are designed to provide enough current to drive a maximum permissible load level since the size of the load is usually unknown. This is typically accomplished by providing the output buffer with an output transistor large enough to drive the maximum permissible load or a number of smaller transistors coupled in parallel to drive the maximum permissible load.

As IC technologies continue to advance, the speed of IC has significantly increased, i.e. the time in which the output of a circuit responds to an input. Increasing speed has resulted in faster rise and fall times of the output voltage and abrupt transitions of output current. One problem is encountered when the conventional output buffers are quickly turned on or off. Since the currents are so large, fast switching of the conventional buffers can induce noise spikes on the power, ground and data buses, thereby causing data errors, latch-up and other problems in the digital electronic circuitry. This problem can be reduced by a technique known as slew rate control.

Slew rate is defined as the rate of output transition in volts per unit time. Conventional digital output buffers with a slew rate control scheme often use RPO resistors in series with the PGATE and NGATE drivers to reduce the abruptness of the transition of state, thereby reducing the noise. However, RPO resistors for the buffer are not ideal as additional masks have to be used for fabricating the RPO resistors. The additional masks increase the costs of the buffer. Furthermore, the design of the buffer with RPO resistors is not flexible, as the masks need to be revised when the buffer is redesigned to operate in a non-slew rate control mode. Finally, the RPO resistors are not an ideal slew rate control scheme and often cause the buffer to generate a crossbar current and consume excessive power.

As such, what is needed is an output buffer that can operate in both the slew rate control mode and the non-slew rate control mode for optimizing its performance and power efficiency.

SUMMARY

The present invention discloses an output buffer for an IC. In one embodiment of the present invention, the output buffer includes a PMOS transistor having a source coupled to an operating voltage, and an NMOS transistor serially coupled between a drain of the PMOS transistor and a complementary operating voltage. A first driver is coupled to a gate of the PMOS transistor for selectively turning on or off the same. A second driver is coupled to a gate of the NMOS transistor for selectively turning on or off the same. A decoder is coupled to the first and second drivers for controlling the first driver or the second driver to turn on the PMOS transistor or the NMOS transistor at a high rate or a low rate in response to the slew rate control signal indicating a slew rate control mode or a non-slew rate control mode.

The construction and method of operation of the invention, however, together with additional objectives and advantages thereof will be best understood from the following description of specific embodiments when read in connection with the accompanying drawings.

DESCRIPTION

Figure 1:
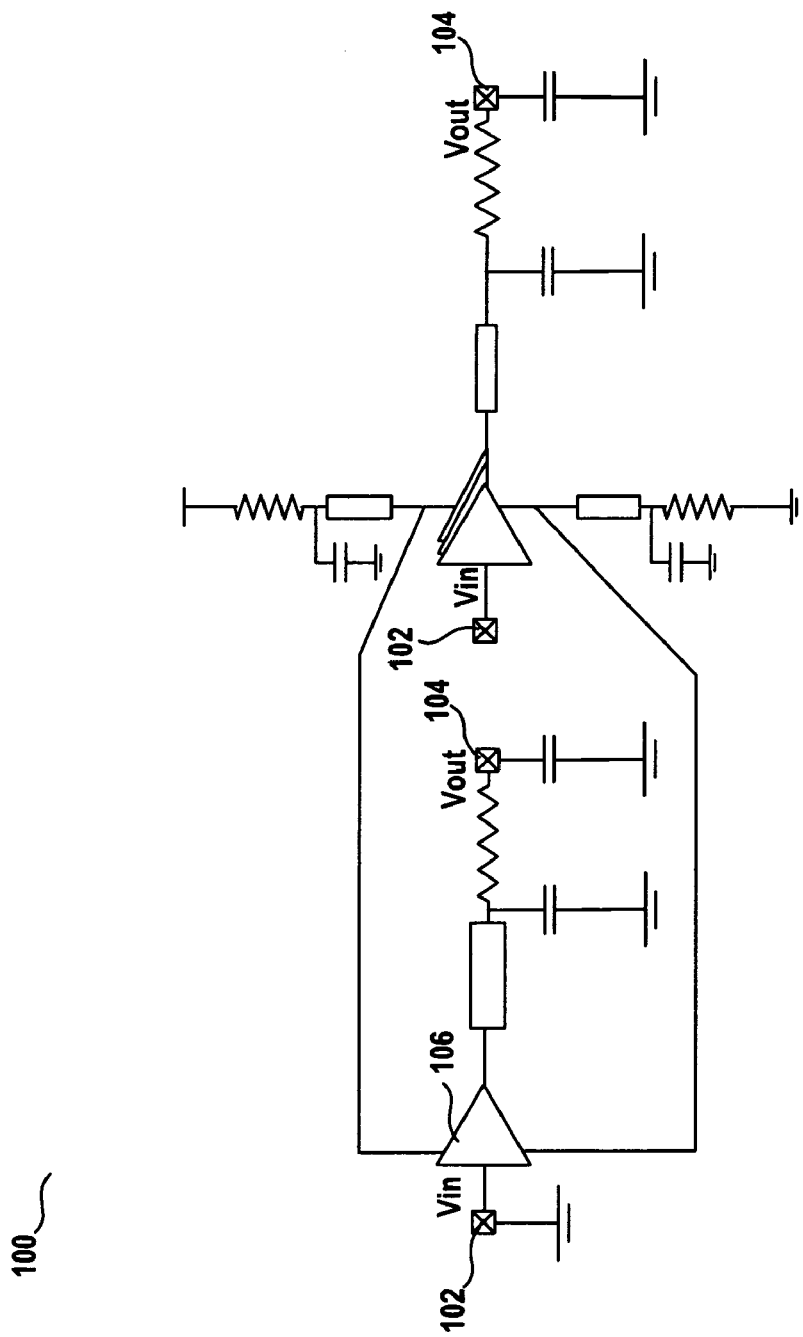
FIG. 1 schematically illustrates a conventional IO circuit.

FIG. 1 illustrates a conventional 10 circuit 100 for an IC. The IO circuit 100 includes input pads 102, outputs pad 104, a buffer 106 and other circuit elements, such as inductors, resistors and capacitors. Connections are made to circuit elements within the IC through bond pads, which are connected to an input buffer or an output buffer. The input buffer typically includes receivers that change the logic levels to be compatible with the requirements of the internal circuits. The output buffer includes drivers that amplify the drive capability in order to efficiently pass output signals from the IC to a remote location.

Figure 2:
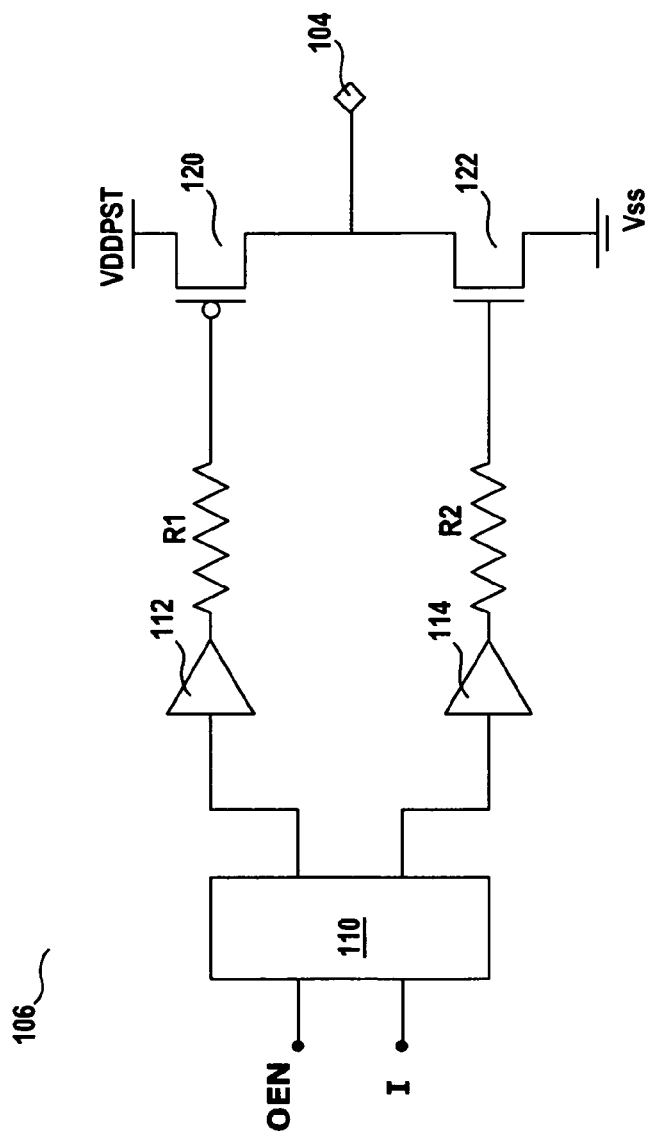
FIG. 2 schematically illustrates a conventional output buffer with resistors for slew rate control.

FIG. 2 illustrates a conventional output buffer 106 as shown in FIG. 1 in more detail. The output buffer 106 has a decoder, 110 that receives input signals OEN and I, and generates output signals to a pair of driver networks PGATE driver 112 and NGATE driver 114. The output signals of the drivers 112 and 114 arrive at the gates of a PMOS transistor 120 and an NMOS transistor 122 via resistors R1 and R2. The resistance provided by resistors R1, R2 combined with the internal capacitance of transistors 120 and 122 forms an RC time constant that creates a delay in their gate signals. The slew rate of the output at the output pad 104 can be controlled by adjusting the resistance of the resistors R1 and R2 in order to reduce noise.

One drawback encountered with this conventional slew rate control scheme is that the resistors R1 and R2 require additional masks in the fabrication process. Such additional masks increase the fabrication costs. Furthermore, the design of the output buffer 106 is not flexible, as the masks for the resistors R1 and R2 need to be revised when the output buffer 106 is redesigned to operate in a non-slew rate control mode.

Another drawback of the conventional output buffer 106 is that the PMOS transistor 120 and the NMOS transistor 122 can be turned on at the same time, thereby generating the crossbar current. This causes the output buffer 106 to consume power inefficiently.

Figure 3:
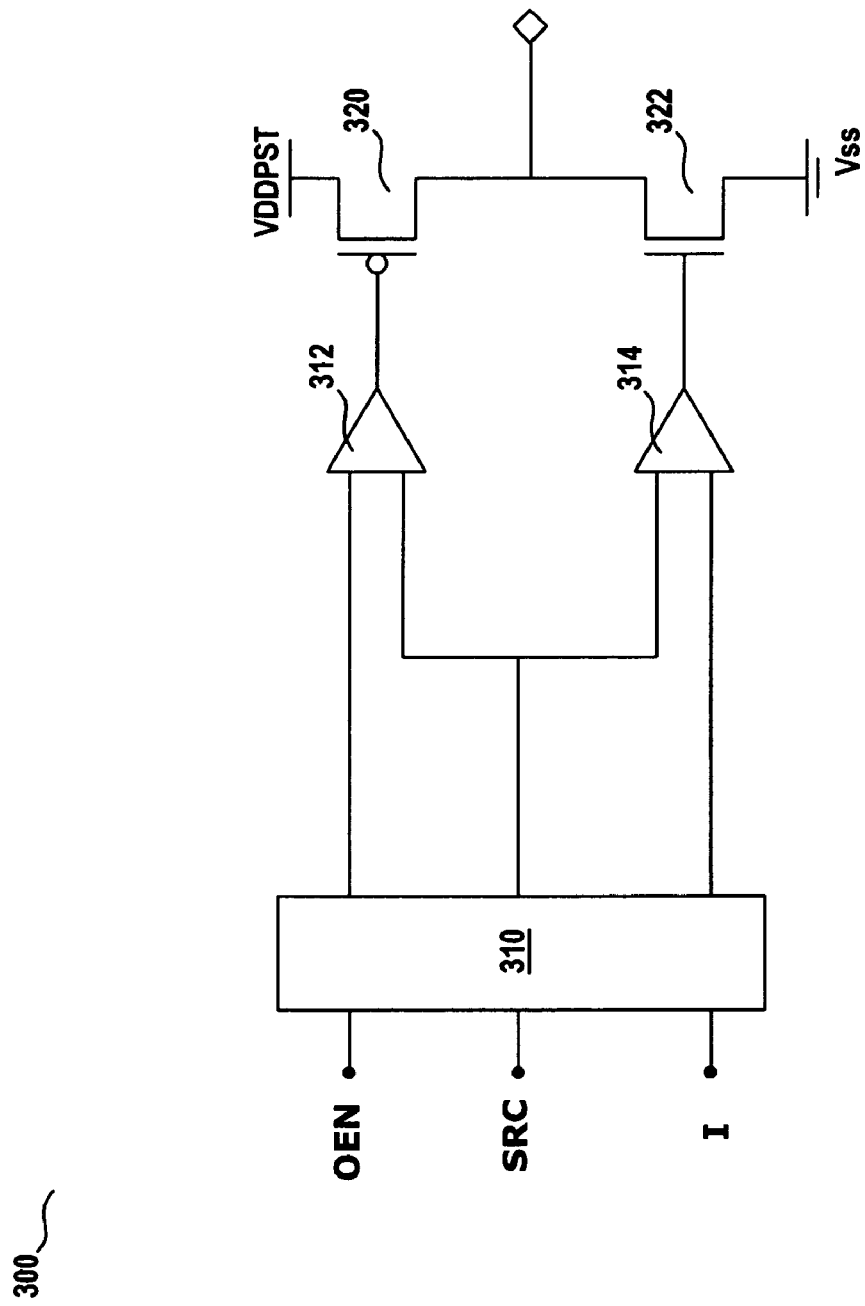
FIG. 3 schematically illustrates an output buffer with a slew rate control scheme in accordance with one embodiment of the present invention.

FIG. 3 illustrates an output buffer 300 with a slew rate control scheme without using resistors in accordance with one embodiment of the present invention. The digital output buffer has input signals OEN, I and an additional input signal called slew rate control (SRC). The input signals are processed by a decoder 310 and delivered to a pair of driver networks, PGATE driver 312 and NGATE driver 314. The decoder 310 generates output signals that are fed to the PGATE driver 312 and NGATE driver 314. The PGATE driver 312 and NGATE driver 314 generate output signals for controlling the gates of a PMOS transistor 320 and NMOS transistor 322 serially coupled between an operating voltage VDDPST and a complementary operating voltage, such as VSS or ground. The PGATE driver 312 and NGATE driver 314 are controlled by the SRC signal for selectively switching the drivers 312 and 314 to operate in a slew rate control mode or a non-slew rate control mode.

Figure 4:
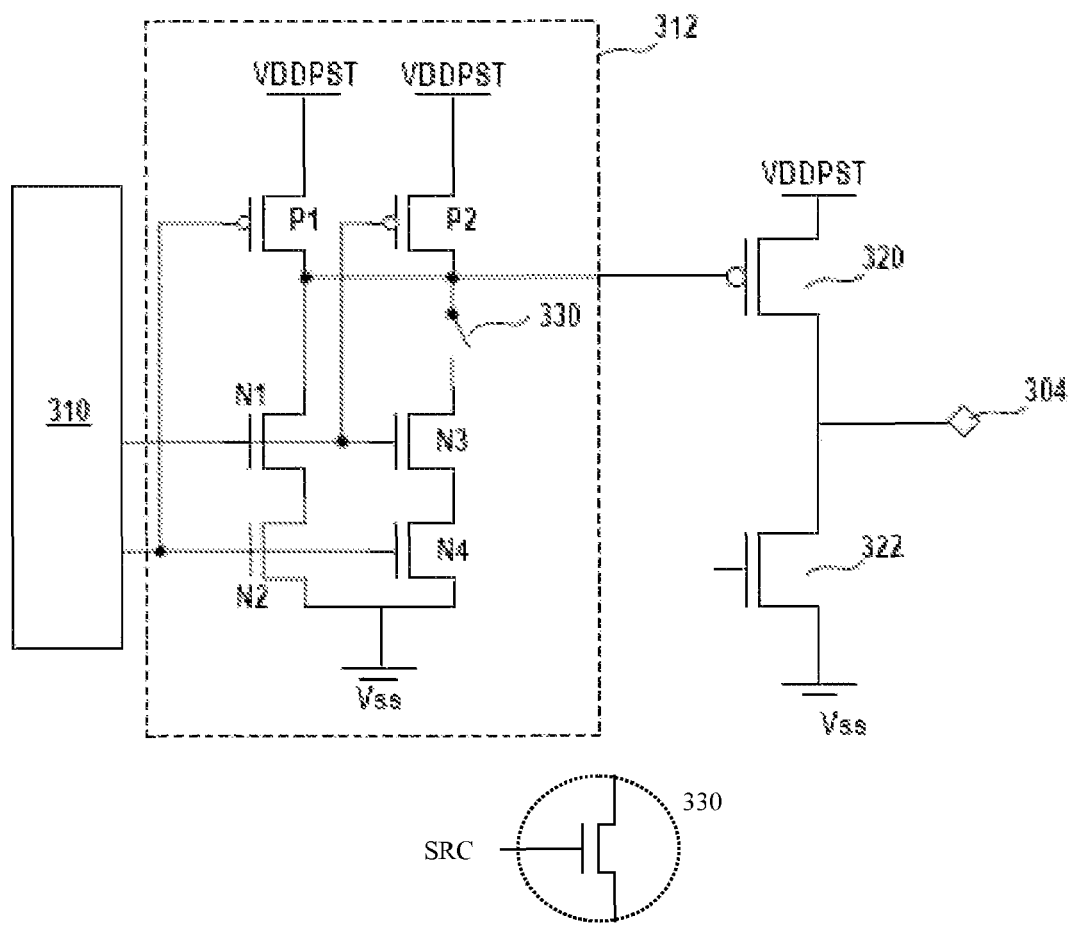
FIG. 4 schematically illustrates a PMOS driver of an output buffer in accordance with one embodiment of the present invention.

FIG. 4 illustrates the PGATE driver 312 for an output buffer in accordance with one embodiment of the present invention. The PGATE driver 312 includes a PMOS transistor P1 and NMOS transistors N1 and N2 serially coupled between the operating voltage VDDPST and the complementary operating voltage such as VSS or ground. The gates of the NMOS transistors N1 and N2 are connected to the output terminals of the decoder 310. The gate of the PMOS transistor P1 is coupled to one of the output terminals of the decoder 310 and the gate of the NMOS transistor N2. The drains of the PMOS transistor P1 and the NMOS transistor N1 are connected to a gate of the PMOS transistor 320, which is serially coupled with the NMOS transistor 322 between the operating voltage VDDPST and the complementary operating voltage such as VSS or ground. A PMOS transistor P2 is coupled between the operating voltage VDDPST and the gate of the PMOS transistor 320. Two NMOS transistors N3 and N4 are serially coupled between the complementary operating voltage and a switch device 330. The gate of the NMOS transistor N3 is coupled to the gate of the NMOS transistor N1, and further to the output terminal of the decoder 310. The gate of the NMOS transistor N4 is coupled to the gate of the NMOS transistor N2, and further to the output terminal of the decoder 310. The gate of the PMOS transistor P2 is coupled to the gate of the NMOS transistor N3 and one of the output terminals of the decoder 310. The switch device 330 selectively couples the drain of the NMOS transistor N3 to the gate of the PMOS transistor 320 in response to the SRC signal indicating that the PGATE driver 312 operates in a slew rate control mode or non-slew rate control mode.

When both the outputs of decoder 310 are high, the PMOS transistors P1 and P2 are in the off state and the NMOS transistors N1, N2, N3, and N4 are in the on state, thereby pulling down the voltage at the gate of the PMOS transistor 320. All other combinations of outputs of the decoder 310 result in a high impedance state on the gate of the PMOS transistor 320.

One feature of the slew rate control for the output buffer is that the PMOS transistor 320 and the NMOS transistor 322 need to be turned off fast and turned on slowly in order to avoid the crossbar current due the simultaneous turning-on of the PMOS transistor 320 and the NMOS transistor 322. When the PGATE driver 312 operates in a slew rate control mode, the switch device 330 is open and the voltage at the gate of the PMOS transistor 320 is pulled down in a relatively slow rate, thereby turning it on slowly. When the PGATE driver 312 operates in a non-slew rate control mode, the switch device 330 is closed and the voltage at the gate of the PMOS transistor 320 is pulled down in a relatively fast rate, thereby turning it on fast. The switch device 330 allows the PGATE driver 312 to flexibly operate in the slew control mode or the non-slew control mode, thereby optimizing the performance of the output buffer.

Figure 5:
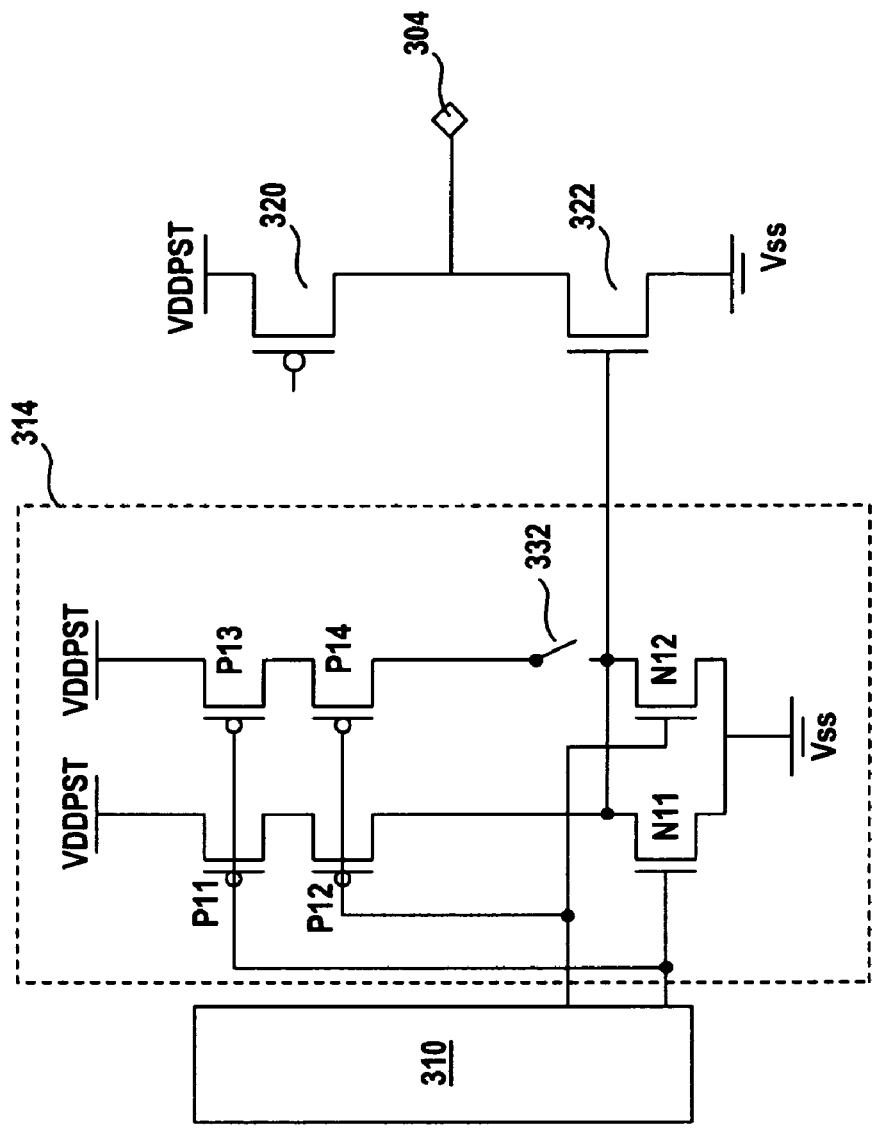
FIG. 5 schematically illustrates a NMOS driver of an output buffer in accordance with one embodiment of the present invention.

FIG. 5 illustrates the NGATE driver 314 for an output buffer in accordance with one embodiment of the present invention. The NGATE driver 314 includes PMOS transistors P11 and P12 and an NMOS transistor N11 serially coupled between the operating voltage VDDPST and the complementary operating voltage such as VSS or ground. The gates of the PMOS transistors P11 and P12 are connected to the output terminals of the decoder 310. The gate of the NMOS transistor N11 is coupled to one of the output terminals of the decoder 310 and the gate of the PMOS transistor P11. The drains of the PMOS transistor P12 and the NMOS transistor N11 are connected to a gate of the NMOS transistor 322, which is serially coupled with the PMOS transistor 320 between the operating voltage VDDPST and the complementary operating voltage such as VSS or ground. An NMOS transistor N12 is coupled between the complementary operating voltage VSS and the gate of the NMOS transistor 322. Two PMOS transistors P13 and P14 are serially coupled between the operating voltage VDDPST and a switch device 332. The gate of the PMOS transistor P13 is coupled to the gate of the PMOS transistor P11, and further to the output terminal of the decoder 310. The gate of the PMOS transistor P14 is coupled to the gate of the PMOS transistor P12, and further to the output terminal of the decoder 310. The gate of the NMOS transistor N12 is coupled to the gate of the PMOS transistor P12 and one of the output terminals of the decoder 310. The switch device 332 selectively couples the drain of the PMOS transistor P14 to the gate of the NMOS transistor 322 in response to the SRC signal indicating that the NGATE driver 314 operates in a slew rate control mode or a non-slew rate control mode.

When both the outputs of decoder 310 are low, the NMOS transistors N11 and N12 are in the off state and the PMOS transistors P11, P12, P13, and P14 are in the on state, thereby pulling up the voltage at the gate of the NMOS transistor 322. All other combinations of outputs of the decoder 310 result in a low voltage state on the gate of the NMOS transistor 322.

One feature of the slew rate control for the output buffer is that the PMOS transistor 320 and the NMOS transistor 322 need to be turned off fast and turned on slowly in order to avoid the crossbar current due to the simultaneous turning-on of the PMOS transistor 320 and the NMOS transistor 322. When the NGATE driver 314 operates in a slew rate control mode, the switch device 332 is open and the voltage at the gate of the NMOS transistor 322 is pulled up in a relatively slow rate, thereby turning it on slowly. When the NGATE driver 314 operates in a non-slew rate control mode, the switch device 332 is closed and the voltage at the gate of the NMOS transistor 322 is pulled up in a relatively fast rate, thereby turning it on fast. The switch device 332 allows the NGATE driver 314 to flexibly operate in the slew control mode or the non-slew control mode, thereby optimizing the performance of the output buffer.

According to the embodiment of the present invention, it is possible to select the slew rate control of the output buffer when needed and the proposed method of the slew rate control results in a reduction of chances of crossbar current, thereby avoiding a waste of power consumption. Moreover, the proposed output buffer achieves the slew rate control without using the RPO resistors. Thus, no additional set of masks are needed in manufacturing the buffer, thereby avoiding the additional costs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. Output buffer for an integrated circuit, comprising:
a PMOS transistor having a source coupled to an operating voltage;
an NMOS transistor serially coupled between a drain of the PMOS transistor and a complementary operating voltage;
a first driver coupled to a gate of the PMOS transistor for selectively turning on or off the same, wherein the first driver comprises first and second current paths coupled to the gate of the PMOS transistor for selectively pulling down a voltage thereat;
a second driver coupled to a gate of the NMOS transistor for selectively turning on or off the same; and
a decoder coupled to the first and second drivers for controlling the first driver or the second driver to turn on the PMOS transistor or the NMOS transistor at a high rate or a low rate in response to a slew rate control signal indicating a slew rate control mode or a non-slew rate control mode, and
wherein the first driver comprises a switch device, which opens in response to the slew rate control signal indicating the slew rate control mode, for preventing the second current path from pulling down the voltage at the gate of the PMOS transistor, and closes in response to the slew rate control signal indicating the non-slew rate control mode, for allowing the second current path to pull up the voltage at the gate of the PMOS transistor.

2. The output buffer of claim 1, wherein when the slew rate control signal indicates the slew rate control mode, the first or second driver turns on the PMOS or NMOS transistor at a low rate.

3. The output buffer of claim 1, wherein when the slew rate control signal indicates the non-slew rate control mode, the first or second driver turns on the PMOS or NMOS transistor at a high rate.

4. The output buffer of claim 1, wherein the second driver comprises first and second current paths coupled to the gate of the NMOS transistor for selectively pulling up a voltage thereat.

5. The output buffer of claim 4, wherein the second driver comprises a switch device, which opens in response to the slew rate control signal indicating the slew rate control mode, for preventing the second current path from pulling up the voltage at the gate of the NMOS transistor.

6. The output buffer of claim 4, wherein the second driver comprises a switch device, which closes in response to the slew rate control signal indicating the non-slew rate control mode, for allowing the second current path to pull up the voltage at the gate of the NMOS transistor.

7. An output buffer for an integrated circuit, comprising:
a PMOS transistor having a source coupled to an operating voltage;
an NMOS transistor serially coupled between a drain of the PMOS transistor and a complementary operating voltage;
a first driver coupled to a gate of the PMOS transistor for selectively turning on or off the same, wherein the first driver comprises first and second current paths coupled to the gate of the PMOS transistor for selectively pulling down a voltage thereat;
a second driver coupled to a gate of the NMOS transistor for selectively turning on or off the same; and
a decoder coupled to the first and second drivers for controlling the first driver or the second driver to turn on the PMOS transistor or the NMOS transistor at a high rate or a low rate in response to a slew rate control signal indicating a slew rate control mode or a non-slew rate control mode,
wherein when the slew rate control signal indicates the slew rate control mode, the first or second driver turns on the PMOS or NMOS transistor at a low rate, and when the slew rate control signal indicates the non-slew rate control mode, the first or second driver turns on the PMOS or NMOS transistor at a high rate, and
wherein the first driver comprises a switch device, which opens in response to the slew rate control signal indicating the slew rate control mode, for preventing the second current path from pulling down the voltage at the gate of the PMOS transistor, and closes in response to the slew rate control signal indicating the non-slew rate control mode, for allowing the second current path to pull up the voltage at the gate of the PMOS transistor.

8. The output buffer of claim 7, wherein the second driver comprises first and second current paths coupled to the gate of the NMOS transistor for selectively pulling up a voltage thereat.

9. The output buffer of claim 8, wherein the second driver comprises a switch device, which opens in response to the slew rate control signal indicating the slew rate control mode, for preventing the second current path from pulling up the voltage at the gate of the NMOS transistor.

10. The output buffer of claim 8, wherein the second driver comprises a switch device, which closes in response to the slew rate control signal indicating the non-slew rate control mode, for allowing the second current path to pull up the voltage at the gate of the NMOS transistor.

11. An output buffer for an integrated circuit, comprising:
a PMOS transistor having a source coupled to an operating voltage;
an NMOS transistor serially coupled between a drain of the PMOS transistor and a complementary operating voltage;
a first driver having first and second current paths coupled to the gate of the PMOS transistor for selectively pulling down or up a voltage thereat;
a second driver having third and fourth current paths coupled to the gate of the NMOS transistor for selectively pulling down or up a voltage thereat; and
a decoder coupled to the first and second drivers for controlling the first driver or the second driver to turn on the PMOS transistor or the NMOS transistor at a high rate or a low rate in response to slew rate control signal indicating a slew rate control mode or a non-slew rate control mode,
wherein the first driver includes a first switch device, which opens in response to the slew rate control signal indicating the slew rate control mode, for preventing the second current path from pulling down the voltage at the gate of the PMOS transistor, and closes in response to the slew rate control signal indicating the non-slew rate control mode, for allowing the second current path to pull up the voltage at the gate of the PMOS transistor, wherein the second driver includes a second switch device, which opens in response to the slew rate control signal indicating the slew rate control mode, for preventing the fourth current path from pulling up the voltage at the gate of the NMOS transistor.

12. The output buffer of claim 11, wherein when the slew rate control signal indicates the slew rate control mode, the first or second driver turns on the PMOS or NMOS transistor at a low rate.

13. The output buffer of claim 11, wherein when the slew rate control signal indicates the non-slew rate control mode, the first or second driver turns on the PMOS or NMOS transistor at a high rate.

14. The output buffer of claim 11, wherein the first and second switch devices close when the slew rate signal indicates the non-slew rate control mode.

* * * * *